Oct. 20, 1970 M. L. HEIMER 3,535,555
RAMP FUNCTION GENERATOR HAVING VOLTAGE CONTROLLED SLOPE
Filed July 26, 1968
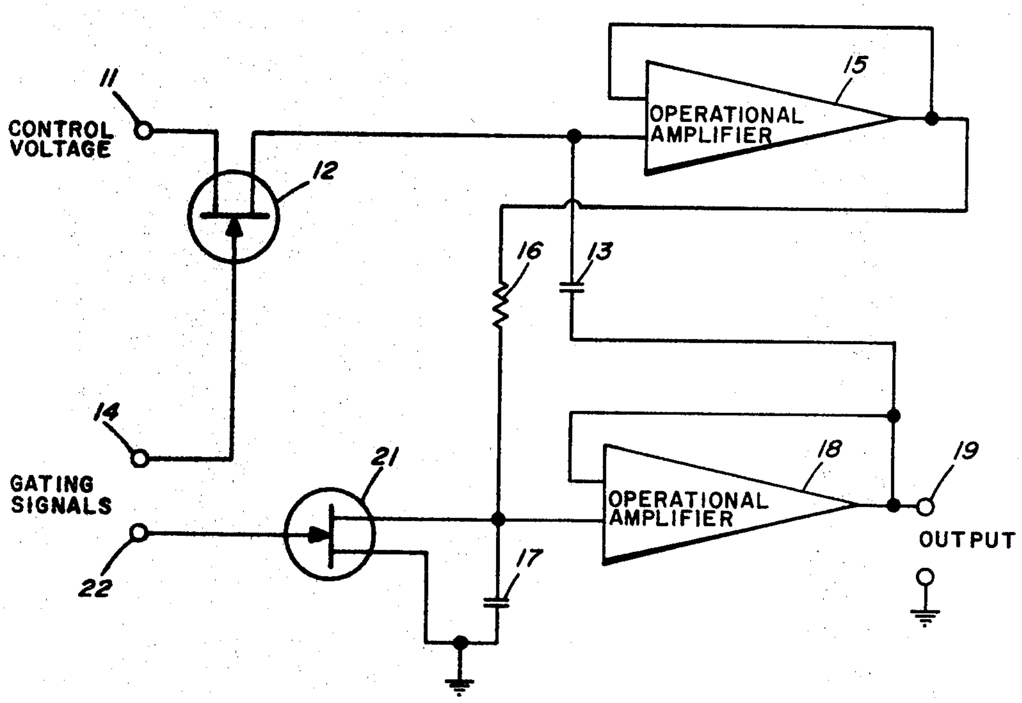
INVENTOR
MALCOLM L. HEIMER
BY H. H. Losche
ATTORNEY 3,535,555
Patented Oct. 20, 1970

3,535,555

RAMP FUNCTION GENERATOR HAVING VOLTAGE CONTROLLED SLOPE

Malcolm L. Heimer, Newhall, Calif., assignor, by mesne assignments, to the United States of America as represented by the Secretary of the Navy Filed July 26, 1968, Ser. No. 747,902
Int. Cl. H03k 17/60
U.S. Cl. 307—251 6 Claims

ABSTRACT OF THE DISCLOSURE

A function generating circuit for producing a linear ramp voltage output signal having a slope proportional to a control voltage of either positive or negative polarity, utilizing field effect transistors, impedance converting operational amplifiers, storage capacitances, and a current controlling resistance. The circuit causes a first capacitance to become charged to the level of an externally applied control voltage, which enables a first operational amplifier to establish a constant current flow, proportional to the control voltage, through a resistance, to linearly charge a second capacitance. The linear charging of the second capacitance produces, via a second operational amplifier, the desired ramp function output signal proportional to the externally applied control voltage and of the same polarity.

BACKGROUND OF THE INVENTION

This invention is in the field of electronic function generating circuitry, and more specifically in the area of sweep circuitry for producing a linear ramp voltage output signal having a slope proportional to an externally applied control voltage of either positive or negative polarity.

In the design and development of multi-mode radar systems, a need has arisen for a device capable of producing a series of linear ramp function sweep signals, the slopes of which are proportional to a control voltage obtained from a slower sweep signal produced in another part of the radar system sweep circuitry, which also supplies the gating signals for initiating and terminating each linear ramp signal. Such a suitable device for use in a multi-mode radar system must be capable of producing its linear ramp function sweep signals with a high degree of reliability, while utilizing a minimum number of components. The present invention fulfills this need.

SUMMARY OF THE INVENTION

The present invention provides a function generating circuitry for producing a linear ramp voltage output signal whose slope is proportional to a control voltage of either positive or negative polarity at a frequency determined by externally applied gating signals. It has found utility as a generator of linear sweep signals in multi-mode radar systems, and is believed to have general utility in applications requiring a linear ramp function generator. The utility of the invention is enhanced by its reliability, resulting from the use of a minimum number of components.

The invention is comprised of a pair of field effect transistors for switching and gating functions, a pair of operational amplifiers of the unity-gain, voltage follower, impedance converting type having very high input impedances and very low output impedances, a pair of storage capacitances, and a resistance. One of the transistors serves as a gating means for coupling the external control voltage to one of the storage capacitances. When this capacitance becomes charged to the level of the control voltage, an external gating signal causes the transistor to switch to its high impedance state, isolating the charged capacitance from the control voltage. The charged capacitance is coupled to the input terminal of one of the operational amplifiers which has its output terminal coupled via a resistance to one terminal of the other storage capacitance which has its remaining terminal grounded. The first capacitance, previously charged to the level of the external control voltage, establishes a constant current flow through the operational amplifier and the resistance, proportional to the external control voltage, to linearly charge the second capacitance. This linear charging of the second capacitance produces the desired ramp function signal which is proportional in slope and polarity to the control voltage. This signal is coupled via the other operational amplifier to an output terminal. A second transistor coupled across the second capacitance serves as a gating means for controlling the initiation of the ramp function signal, and for terminating it at any desired point and resetting the circuit for generation of the next ramp signal, in response to externally applied gating signals.

BRIEF DESCRIPTION OF THE DRAWING

The objects and attendant advantages, features, and uses of the invention will become apparent from the following detailed description when considered in conjunction with the accompanying figure of drawing which depicts a schematic diagram of a suitable embodiment of the invention.

DESCRIPTION OF THE PREFERRED EMBODIMENT

Referring more particularly to the embodiment of the invention shown in the figure of drawing, an input terminal 11 is provided for receiving an externally applied control voltage. Terminal 11 is coupled to one of the conduction electrodes of a field effect transistor 12, which has its other conduction electrode coupled to one terminal of a storage capacitance 13, and its gate electrode coupled to a terminal 14 for receiving externally applied gating signals. Transistor 12 serves as a switch to couple terminal 11 to capacitance 13 in response to gating signals applied to terminal 14. The one terminal of capacitance 13 is also coupled to the input terminal of an operational amplifier 15, which has its output terminal coupled to one terminal of a resistance 16. The other terminal of resistance 16 is coupled to one terminal of a storage capacitance 17, which has its other terminal coupled to ground potential. The junction of resistance 16 and capacitance 17 is coupled to the input terminal of an operational amplifier 18 whose output is coupled to the circuit output terminal 19 and to the other terminal of capacitance 13. A field effect transistor 21 has one of its conduction electrodes coupled to the junction of resistance 16, capacitance 17, and operational amplifier 18. Its other conduction electrode is coupled to ground potential, and its gate electrode is coupled to a terminal 22 for receiving externally applied gating signals. Transistor 21 serves as a gating means for controlling the initiation of the ramp function signal when gated to its high impedance or nonconducting state. It also serves as a termination and resetting switch to terminate the production of the linear ramp signal at any desired time and prepare the circuit for the next signal, when gated to its low impedance state which discharges capacitance 17 directly, and capacitance 13 via operational amplifier 18, to ground potential.

Operational amplifiers 15 and 18 are utilized as impedance converters, having very high input impedance, very low output impedance, and unity gain. Amplifiers of this type for use as voltage following isolation buffers and impedance converters are well known in the art. An article entitled "Review of Operational Amplifier Principles," by C. V. Weden (Instrumentation Application Bulletin, July 1966, Fairchild Instrumentation, 475 Ellis Street, Mountain View, Calif.) illustrates such operational amplifiers and shows a unity-gain voltage follower in FIG. 15, page 17. A table of comparative specifications of available operational amplifiers is shown on page 6 of the Bulletin, and the "FET-Input" type (Field Effect Transistor) would be suitable for use in this invention.

OPERATION

The operation of the ramp function generator comprising the invention occurs in the following manner. Initially, it will be assumed that transistors 12 and 21 are in their respective nonconducting or high impedance states, and that an external control voltage is applied between input terminal 11 and ground potential. The purpose of the invention is to produce a linear ramp function signal between output terminal 19 and ground potential, the slope of which is proportional to the value of the control voltage present between input terminal 11 and ground potential immediately preceding the production of the ramp function signal.

To initiate operation of the invention externally produced gating potentials are applied to gating terminals 14 and 22. The gating potential applied to the gate electrode of transistor 21, via terminal 22, places it in a conducting or low impedance state, thereby providing a direct discharge path to ground potential for capacitance 17. The output of operational amplifier 18 follows the potential on capacitance 17 due to the coupling of the amplifier input to the junction of capacitance 17 and resistance 16. The terminal of capacitance 13 which is coupled to the output of amplifier 18 is thereby established at ground potential by virtue of capacitance 17 being coupled to ground through conducting transistor 21. Thus the gating pulse applied at terminal 22 causes transistor 21 to conduct, removing any pre-existing charge on capacitance 17 and causing output terminal 19 and the terminal of capacitance 13 coupled thereto to become established at ground potential.

The gating potential applied to the gate electrode of transistor 12, via terminal 14, places it in a conducting or low impedance state, coupling input terminal 11 and the external control voltage applied thereto directly to the top of capacitance 13. Since the other terminal of capacitance 13 is held at ground potential via amplifier 18 and conducting transistor 21, capacitance 13 will immediately become charged to the level of the external control voltage applied to terminal 11. The invention is thus prepared to begin the production of the desired linear ramp function output signal having a slope proportional to the external control voltage, which is now stored on capacitance 13.

To begin production of the ramp function signal at output terminal 19, the external gating potentials applied to terminals 14 and 22 are changed to cause transistors 12 and 21 respectively, to switch to their nonconducting or high impedance states. When transistors 12 and 21 cease to conduct, the potential produced by the charge previously stored on capacitance 13 by the external control voltage is present at the input of operational amplifier 15. Since operational amplifiers 15 and 18 are both voltage followers having unity gain, very high input impedance, and very low output impedance, the potential present at the output of amplifier 15 is the same potential present at its input. This potential, established by the charge on capacitance 13, produces a constant current flow through resistance 16 to linearly charge previously discharged capacitance 17. Capacitance 13 is sufficiently large that it will not be significantly discharged by the current which it must supply to the high impedance input of operational amplifier 15. Tht voltage following and isolation action of operational amplifiers 15 and 18 maintains the potential across resistance 16 equal to the potential of the external control voltage stored on capacitance 13. As a result, the current flow through resistance 16 is maintained constant and directly proportional to the external control potential stored on capacitance 13. This constant charging current linearly charges capacitance 17. The linear charging of capacitance 17 causes the potential at the junction of capacitance 17 and resistance 16 to rise linearly from ground potential, thereby producing a linear ramp function potential with respect to ground at the input of operational amplifier 18. Voltage following operational amplifier 18 reproduces this linear ramp function signal at its output and thereby at the invention output terminal 19 for utilization by following circuitry.

This linear ramp function signal may be terminated at any desired point in time and a new ramp function signal begun, as necessitated by a particular application, by changing the gating potentials applied to terminals 14 and 22 to cause transistors 12 and 21 respectively to switch to their low impedance or conducting states. Conducting transistor 21 will discharge capacitance 17 and return one terminal of capacitance 13 to ground potential, while conducting transistor 12 will allow a new value of external control voltage present at input terminal 11 to be stored on capacitance 13. The invention has now recycled and is ready to begin the production of another linear ramp function signal at output terminal 19, when transistors 12 and 21 are switched to their nonconducting states by a change in the gating potentials applied to terminals 14 and 22.

The device responds equally well to either positive or negative control potentials applied to terminal 11, to produce corresponding positive or negative slope, linear ramp function signals whose slopes are, proportional to the magnitude of the applied control potentials. The invention may be utilized to produce a series of sweep voltages the slopes of which vary in proportion to a slower sweep signal, which is utilized as the control potential at terminal 11.

Thus it may be seen, in view of the foregoing explanation and figure of drawing, that the invention, a ramp function generator having voltage controlled slope, is a useful and necessary device.

While many modifications may be made by replacing various elements and components with equivalent structures, it is to be understood that I desire to be limited in the spirit of my invention only by the scope of the appended claims.

I claim:

1. A function generating device for producing a linear ramp function output signal having a slope proportional to a control voltage comprising:

input means for receiving a control voltage;

first electrical storage means for storing said control voltage;

first gating means coupled between said first input means and one terminal of said first electrical storage means for coupling said control voltage thereto in response to appropriate gating signals;

electrical resistance means;

first electrical impedance converting means coupled between said one terminal of said first electrical storage means and one terminal of said electrical resistance means;

second electrical storage means coupled between the other terminal of said electrical resistance means and ground potential, said second electrical storage means for producing said linear ramp function output signal while being charged by a constant current flow established through said electrical resistance means by said control voltage stored on said first electrical storage means;

second gating means coupled in parallel with said second electrical storage means for controlling the initiation and termination of said linear function output signal in response to appropriate gating signals;

second electrical impedance converting means coupled between the junction of said electrical resistance means and said second electrical storage means, and the other terminal of said first electrical storage means; and output means coupled to the junction of said second electrical impedance converting means and said other terminal of said first electrical storage means, for providing thereat said linear ramp function output signal.

2. A function generating device for producing a linear ramp function output signal having a slope proportional to a control voltage, as set forth in claim 1 wherein said first and second electrical storage means are each comprised of electrical capacitance means.

3. A function generating device for producing a linear ramp function output signal having a slope proportional to a control voltage, as set forth in claim 2 wherein said first and second gating means are each comprised of field effect transistor switch means whose gate electrodes are coupled to receive said appropriate gating signals.

4. A function generating device for producing a linear ramp function output signal having a slope proportional to a control voltage, as set forth in claim 3 wherein said first and second electrical impedance converting means are each comprised of a voltage following, unity gain operational amplifier having high input impedance and low output impedance, said first electrical impedance converting means being coupled in such direction that its input is coupled to said one terminal of said first electrical storage means and its output is coupled to said one terminal of said electrical resistance means, and said second electrical impedance converting means being coupled in such direction that its input is coupled to said junction of said electrical resistance means and said second electrical storage means and its output is coupled to said other terminal of said first electrical storage means and to said output means.

5. A function generating device for producing a linear ramp function output signal having a slope proportional to a control voltage, as set forth in claim 1 wherein said first and second gating means are each comprised of field effect transistor switch means whose gate electrodes are coupled to receive said appropriate gating signals.

6. A function generating device for producing a linear ramp function output signal having a slope proportional to a control voltage, as set forth in claim 1 wherein said first and second electrical impedance converting means are each comprised of a voltage following, unity gain operational amplifier having high input impedance and low output impedance, said first electrical impedance converting means being coupled in such direction that its input is coupled to said one terminal of said first electrical storage means and its output is coupled to said one terminal of said electrical resistance means, and said second electrical impedance converting means being coupled in such direction that its input is coupled to said junction of said electrical resistance means and said second electrical storage means and its output is coupled to said other terminal of said first electrical storage means and to said output means.

References Cited

UNITED STATES PATENTS

| | | | |
|---|---|---|---|
| 2,891,173 | 6/1959 | Helbig | 307—228 |
| 2,998,532 | 8/1961 | Smeltzer | 307—228 |
| 3,011,068 | 11/1961 | McVey | 328—183 XR |
| 3,470,495 | 9/1969 | Deboo | 307—228 XR |

FOREIGN PATENTS

| | | |
|---|---|---|
| 646,809 | 8/1962 | Canada. |

OTHER REFERENCES

IBM Technical Disclosure Bulletin, vol. 11, No. 3, August 1968, p. 247, titled Linear Ramp Generator, by J. W. Brookman.

STANLEY T. KRAWCZEWICZ, Primary Examiner

U.S. Cl. X.R.

307—228, 246, 263; 328—181, 183, 185